US010291139B2

(12) United States Patent
Torrico-Bascopé

(10) Patent No.: US 10,291,139 B2
(45) Date of Patent: May 14, 2019

(54) TWO-TRANSFORMER THREE-PHASE DC-DC RESONANT CONVERTER

(71) Applicant: Huawei Technologies Co., Ltd., Shenzhen (CN)

(72) Inventor: Grover Victor Torrico-Bascopé, Kista (SE)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/881,359

(22) Filed: Jan. 26, 2018

(65) Prior Publication Data

US 2018/0152112 A1 May 31, 2018

Related U.S. Application Data

(63) Continuation of application No. PCT/EP2016/066080, filed on Jul. 7, 2016.

(51) Int. Cl.

*H02M 3/335* (2006.01)
*H01F 27/29* (2006.01)
*H02M 1/00* (2006.01)
*H01L 29/20* (2006.01)
*H02M 1/08* (2006.01)

(52) U.S. Cl.

CPC ........ *H02M 3/33592* (2013.01); *H01F 27/29* (2013.01); *H02M 3/33584* (2013.01); *H01L 29/2003* (2013.01); *H02M 1/083* (2013.01); *H02M 2001/0058* (2013.01); *Y02B 70/1433* (2013.01); *Y02B 70/1491* (2013.01); *Y02P 80/112* (2015.11)

(58) Field of Classification Search

CPC .................................................... H02M 3/335

See application file for complete search history.

(56) References Cited

U.S. PATENT DOCUMENTS 6,466,465 B1 * 10/2002 Marwali ................ H02M 1/32 361/79
7,932,693 B2 * 4/2011 Lee .................. H02M 7/53875 318/701
2004/0136215 A1 7/2004 Tsay et al.
2015/0263640 A1 * 9/2015 Russell .................. H02M 7/06 363/126

(Continued)

FOREIGN PATENT DOCUMENTS

EP 2887523 A1 6/2015
EP 1756935 B1 9/2016

OTHER PUBLICATIONS

Engel, S., et al., "Dynamic and Balanced Control of Three-Phase High-Power Dual-Active Bridge DC-DC Converters in DC-Grid Applications," IEEE Transactions on Power Electronics, vol. 28, No. 4, Apr. 2013, pp. 1880-1889.

(Continued)

*Primary Examiner* — Timothy J. Dole
*Assistant Examiner* — Ishrat F Jamali
(74) *Attorney, Agent, or Firm* — Conley Rose, P.C.

(57) ABSTRACT

A transformer circuit includes a first transformer, a second transformer and an inductor, where a first terminal of the first transformer is coupled to a first terminal of the second transformer. The inductor is coupled between a second terminal of the first transformer and a second terminal of the second transformer.

14 Claims, 7 Drawing Sheets

(56) References Cited

U.S. PATENT DOCUMENTS

| | | | | |
|---|---|---|---|---|
| 2016/0254756 | A1* | 9/2016 | Yang | H01F 30/12 363/21.02 |
| 2016/0268916 | A1* | 9/2016 | Ramsay | H02M 5/458 |
| 2017/0349054 | A1* | 12/2017 | Yang | H02M 7/44 |

OTHER PUBLICATIONS

Almardy, M., "Three-phase (LC)(L)-type series-resonant converter with capacitive output filter," IEEE Transactions on Power Electronics, vol. 26, No. 4, Apr. 2011, pp. 1172-1183.

Foreign Communication From a Counterpart Application, PCT Application No. PCT/EP2016/066080, International Search Report dated Apr. 13, 2017, 12 pages.

* cited by examiner

TWO-TRANSFORMER THREE-PHASE DC-DC RESONANT CONVERTER

CROSS-REFERENCE TO RELATED APPLICATIONS

The application is a continuation of International Patent Application No. PCT/EP2016/066080 filed on Jul. 7, 2016, which is hereby incorporated by reference in its entirety.

TECHNICAL FIELD

The aspects of the present disclosure relate generally to power conversion apparatus and in particularly, to resonant direct current (DC) to DC power converters.

BACKGROUND

Resonant DC to DC converters are considered to be attractive power conversion solutions for the many benefits they can provide. Following a resonant tank with transformers provides galvanic isolation which is important for level conversion as well as for safety. In certain applications, galvanic isolation is required for proper operation. Resonant converters also have inherent properties, such as soft switching of the semiconductor switches, which lead to high efficiency and low noise.

The developing trends of the isolated DC-DC converters are very high efficient, high power density and low cost. The resonant DC-DC converters are suitable technology to achieve high efficiency in power converters due to the intrinsic capability to achieve soft switching (i.e., zero voltage switching (ZVS) and zero current switching (ZCS)). It is also possible to increase the switching frequencies in order to reduce the size of the reactive components of the system.

However, there are still drawbacks regarding the conventional three-phase resonant converter operating at high frequency (HF). Galvanic isolation in three-phase converters poses challenges in the construction and the connection types of the three-phase resonant converter. The common transformer and transformer connections types for the three-phase resonant converter are three winding transformers. The cost of this existing technology increases with attempts at higher efficiency and reduced volume and weight.

Accordingly, it would be desirable to provide a DC-DC converter topology that addresses at least some of the problems identified above.

SUMMARY

It is an object of the present application to provide improved resonant DC to DC converter topologies that can deliver better efficiency and lower noise from smaller packages. This object is solved by the subject matter of the independent claims. Further advantageous modifications can be found in the dependent claims.

According to a first aspect of the present application the above and further objects and advantages are obtained by a transformer circuit that includes a first transformer and a second transformer, a first terminal of the first transformer connected to a first terminal of the second transformer, and an inductor connected between a second terminal of the first transformer and a second terminal of the second transformer. The aspects of the disclosed embodiments provide a topological circuit for a three-phase DC-DC converter with a reduced number of transformers or transformer windings. This allows for a simplified and more efficient layout of the converter due to the reduction in transformer windings.

In a first possible implementation form of the transformer circuit according to the first aspect as such the transformer circuit includes a primary side of three connections points configured to receive a three-phase power input, the primary side comprising a first input node formed by a connection of the second terminal of the first transformer and a first terminal of the inductor, a second input node formed by the connection of the first terminal of the first transformer and the first terminal of the second transformer and a third input node formed by a connection of the second terminal of the second transformer and a second terminal of the inductor. This implementation form provides a two-winding transformer for a three-phase resonant converter.

In a second possible implementation form of the transformer circuit according to the first aspect as such or according to the first possible implementation form of the first aspect the first input node is configured to receive a first phase of the three-phase power input, the second node is configured to receive a second phase of the three-phase power input and the third node is configured to receive a third phase of the three-phase power input. This implementation form provides a two-winding transformer for a three-phase resonant converter.

In a third possible implementation form of the transformer circuit according to the first aspect as such or according to any one of the preceding possible implementation forms of the first aspect the primary side of the transformer circuit is configured to be connected to a resonant tank circuit to receive the three-phase power input. This implementation form provides a two-winding transformer for a three-phase resonant converter.

In a fourth possible implementation form of the transformer circuit according to the third possible implementation form of the first aspect as such the first input node is configured to be connected to a first branch of the resonant tank circuit to receive the first phase of the three-phase power input, the second input node is configured to be connected to a second branch of the resonant tank circuit to receive the second phase of the three-phase power input and the third input node is connected to a third branch of the resonant tank circuit to receive the third phase of the three-phase power input. This implementation form provides a two-winding transformer for a three-phase resonant converter, which simplifies the construction and layout of the converter.

In a fifth possible implementation form of the transformer circuit according to the first aspect as such or according to any one of the preceding possible implementation forms of the first aspect the transformer circuit includes a secondary side configured to deliver a three-phase power output, the secondary side comprising a first output node formed by a third terminal of the first transformer, a second output node formed by a connection of a fourth terminal of the first transformer and a fourth terminal of the second transformer, and a third output node formed by a third terminal of the second transformer. The two-transformer topological circuit for a resonant converter provides a three-phase power output with greater efficiency than can be achieved with three-transformer circuits.

In a sixth possible implementation form of the transformer circuit according to the fifth possible implementation form of the first aspect as such the secondary side is configured to be connected to a three-phase rectifier circuit to deliver the three-phase power output, the first output node being configured to be connected to a first branch of the rectifier circuit, the second output node being configured to be connected to a second branch of the rectifier circuit and the third output node being configured to be connected to a third branch of the rectifier circuit. The two-transformer topological circuit for a resonant converter provides a three-phase power output with greater efficiency than can be achieved with three-transformer circuits.

According to a second aspect of the present application the above and further objects and advantages are obtained by a resonant converter circuit that includes a resonant tank circuit, and a transformer circuit according to the first aspect or any one of the first through seventh possible implementation forms of the first aspect, wherein a resonant tank circuit is connected to a primary side of the transformer circuit. The aspects of the disclosed embodiments provide a resonant converter that includes a transformer circuit with only two transformer windings. The reduced number of windings lowers the volume of the resonant converter, as well as lowering weight and cost while providing higher efficiency and reliability.

In a first possible implementation form of the second aspect as such, the resonant tank circuit comprises a first branch, a second branch and a third branch, wherein the first branch is configured to be connected to the first input node of the transformer circuit, the second branch is configured to be connected to the second input node of the transformer circuit, and the third branch is configured to be connected to the third input node of the transformer circuit. The aspects of the disclosed embodiments provide resonant converter that is configured for three-phase and includes a transformer circuit with only two transformer windings. The reduced number of windings lowers the volume of the converter, as well as weight and cost while providing higher efficiency and reliability.

In a second possible implementation form of the second aspect as such or according to the first possible implementation form of the second aspect the first branch is configured to be connected between a first input node of the resonant tank circuit and the first input node of the transformer circuit, the second branch is configured to be connected between a second input node of the resonant tank circuit and the input node of the transformer circuit, and the third branch is configured to be connected between a third input node of the resonant tank circuit and the third input node of the transformer circuit. The aspects of the disclosed embodiments provide a three-phase resonant converter with a transformer circuit that has only two transformer windings. The reduced number of windings lowers the volume of the converter, as well as weight and cost while providing higher efficiency and reliability.

In a third possible implementation form of the second aspect as such, or according to any one of the preceding possible implementation forms of the second aspect, the first branch comprises a first branch inductor connected in series with a first branch capacitor, a first end of the first branch is configured to be connected to the first node of the transformer circuit, the second branch comprises a second branch inductor connected in series with a second branch capacitor, a first end of the second branch is configured to be connected to the second node of the transformer circuit, and the third branch comprises a third branch inductor connected in series with a third branch capacitor, a first end of the third branch is configured to be connected to the third node of the transformer circuit. The resonant converter of the disclosed embodiments includes a two-winding transformer circuit that is configured to connect to each branch of a three-phase resonant tank circuit to provide a three-phase power output.

According to a third aspect of the present application the above and further objects and advantages are obtained by a three-phase resonant DC-DC converter system that includes a primary side, a secondary side and a transformer circuit according to any one of the preceding aspects and possible implementation forms connected between the primary side and the secondary side. The aspects of the disclosed embodiments provide a three-phase resonant converter with a transformer circuit that includes only two transformer windings. The reduced number of windings in the transformer circuit lowers the volume, weight and cost of the converter system, while providing higher efficiency and reliability.

In a first possible implementation form of the three-phase resonant DC-DC converter system according to the third aspect as such the primary side comprises a DC voltage input circuit configured to receive a DC input voltage, a resonant tank circuit configured to be connected to the transformer circuit to provide the three-phase power input to the transformer circuit and a switching circuit connected between the DC voltage input circuit and the resonant tank circuit. The resonant converter system of the disclosed embodiments can be applied to any three-phase topological circuit.

In a second possible implementation of the three-phase resonant DC-DC converter system according to third aspect as such, or according to the first possible implementation form of the third aspect, the secondary side comprises a three-phase rectification circuit connected between the transformer circuit and a DC voltage output circuit, the rectification circuit configured to receive the three-phase power output signal from the transformer circuit. The resonant converter system of the disclosed embodiments can be applied to any three-phase topological circuit to provide a three-phase power output.

In a third possible implementation form of the three-phase resonant DC-DC converter system according to the third aspect as such or according to any one of the preceding possible implementation forms of the third aspect the switching circuit is a multi-level three-phase switching converter. The resonant converter system of the disclosed embodiments can be implemented in any suitable three-phase topological circuit including high-voltage applications.

In a fourth possible implementation form of the three-phase resonant DC-DC converter system according to the third aspect as such or according to any one of the preceding possible implementation forms of the third aspect the switches in the switching circuit and switches in the rectification circuit comprise gallium-nitride (GaN) transistors. The use of GaN devices increases efficiency at a reduced cost.

These and other aspects, implementation forms, and advantages of the exemplary embodiments will become apparent from the embodiments described herein considered in conjunction with the accompanying drawings. It is to be understood, however, that the description and drawings are designed solely for purposes of illustration and not as a definition of the limits of the disclosed application, for which reference should be made to the appended claims. Additional aspects and advantages of the application will be set forth in the description that follows, and in part will be obvious from the description, or may be learned by practice of the application. Moreover, the aspects and advantages of the application may be realized and obtained by means of the instrumentalities and combinations particularly pointed out in the appended claims.

BRIEF DESCRIPTION OF THE DRAWINGS

In the following detailed portion of the present disclosure, the application will be explained in more detail with reference to the example embodiments shown in the drawings.

DETAILED DESCRIPTION OF THE DISCLOSED EMBODIMENTS

Figure 1:
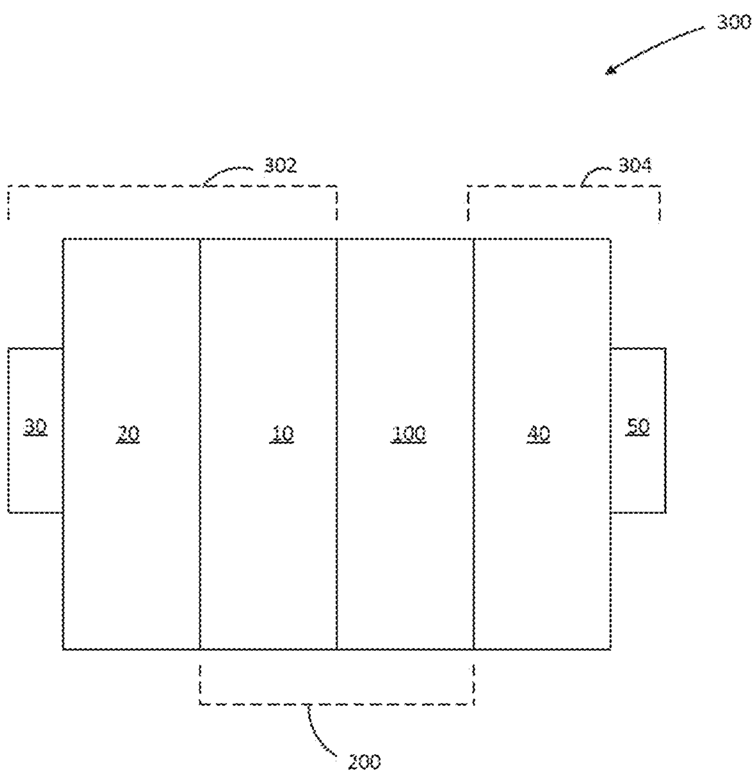
FIG. 1 is a block diagram illustrating an exemplary three-phase DC-DC resonant converter system incorporating aspects of the disclosed embodiments.

Referring to FIG. 1 there can be seen an exemplary block diagram of a DC-DC three-phase resonant converter system 300 incorporating aspects of the disclosed embodiments. As shown in FIG. 1, the DC-DC three-phase resonant converter system 300 generally includes an input circuit or primary side 302, and an output circuit or secondary side 304. The primary side 302 generally comprises a DC voltage input circuit 30, an inverter circuit 20 and a resonant tank circuit 10. The secondary side 304 generally includes a rectification circuit 40 and a DC output voltage circuit 50. A transformer circuit 100 is connected between the primary side 302 and the secondary side 304. The aspects of the disclosed embodiments are directed to a topological circuit of a three-phase DC-DC resonant converter system 300 that includes a two winding HF transformer connection rather than the typical three winding transformer connection. Reducing the number of transformer windings, lowers the volume, weight and cost of the converter. The construction and layout of the converter system 300 is simplified, and the efficiency of the system 300 is improved.

Figure 2:
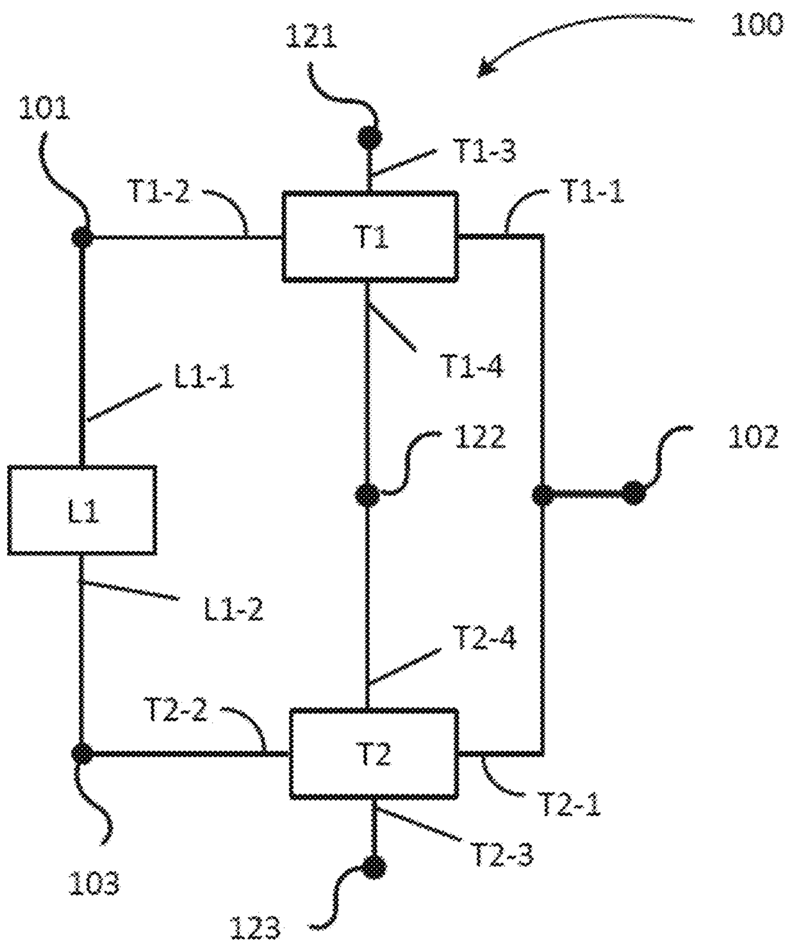
FIG. 2 illustrates a schematic diagram of an exemplary transformer circuit incorporating aspects of the disclosed embodiments.

FIG. 2 illustrates a schematic block diagram of an exemplary transformer circuit 100 incorporating aspects of the disclosed embodiments. The transformer circuit 100 is a two-winding HF transformer circuit that is suitable for a high efficiency, high power density and low cost DC-DC converter in any application that requires galvanic isolation and independence between the input voltage value and the output voltage value of the converter system.

The transformer circuit 100 of the disclosed embodiments includes two HF transformers T1 and T2. The transformers T1 and T2 can comprise two single transformers. Alternatively, the transformers T1 and T2 can be integrated in one single core, which can be referred to as a two winding transformer. In one embodiment, the transformers T1 and T2 are HF transformers with a turns ratio of n:1. For the purposes of the disclosure herein, the two transformers, or transformer windings, will be referred to as transformers T1 and T2.

As shown in FIG. 2, a first terminal T1-1 of the first transformer T1 is connected to a first terminal T2-1 of the second transformer T2. An inductor L1 is connected between a second terminal T1-2 of the first transformer T1 and a second terminal T2-2 of the second transformer T2.

The primary side of the transformer circuit 100 shown in FIG. 2 includes three connection points or nodes 101, 102 and 103. The first connection point 101, also referred to as the first input node 101, is formed by the connection of the second terminal T1-2 of the first transformer T1 and a first terminal L1-1 of the inductor L1. A second connection point or input node 102 is formed by the connection of the first terminal T1-1 of the first transformer T1 and the first terminal T2-1 of the second transformer T2. The third connection point or input node 103 is formed by the connection of the second terminal T2-2 of the second transformer T2 and the second terminal L1-2 of the inductor L1. The first, second and third input nodes 101, 102 and 103, are configured to receive the first, second and third phases, respectively, of a three-phase input power.

Figure 3:
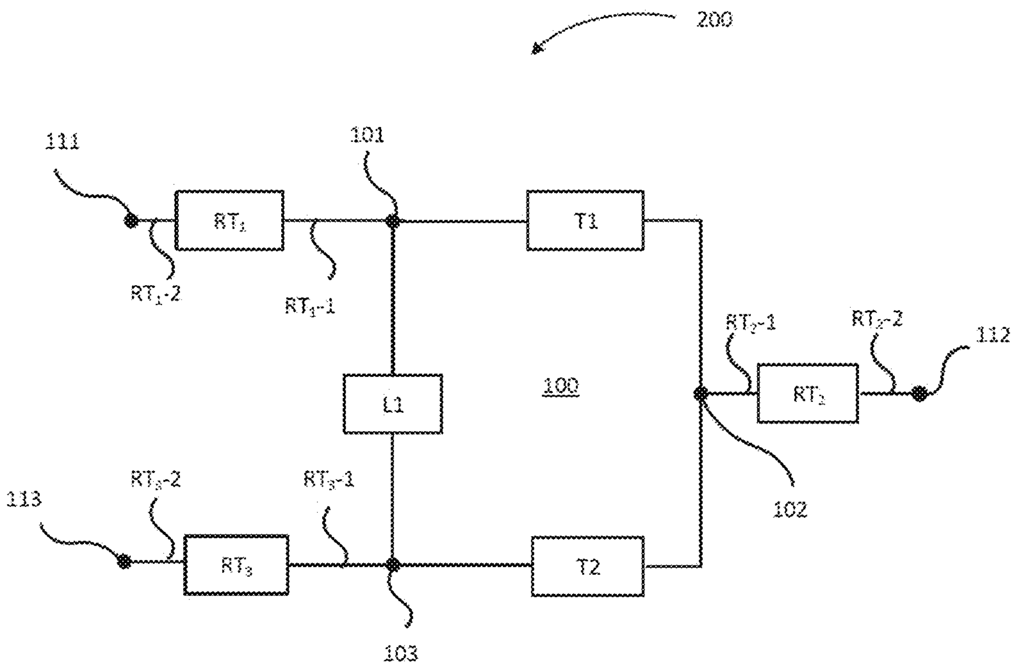
FIG. 3 illustrates a schematic diagram of an exemplary three-phase DC-DC resonant converter circuit incorporating aspects of the disclosed embodiments.
Figure 4:
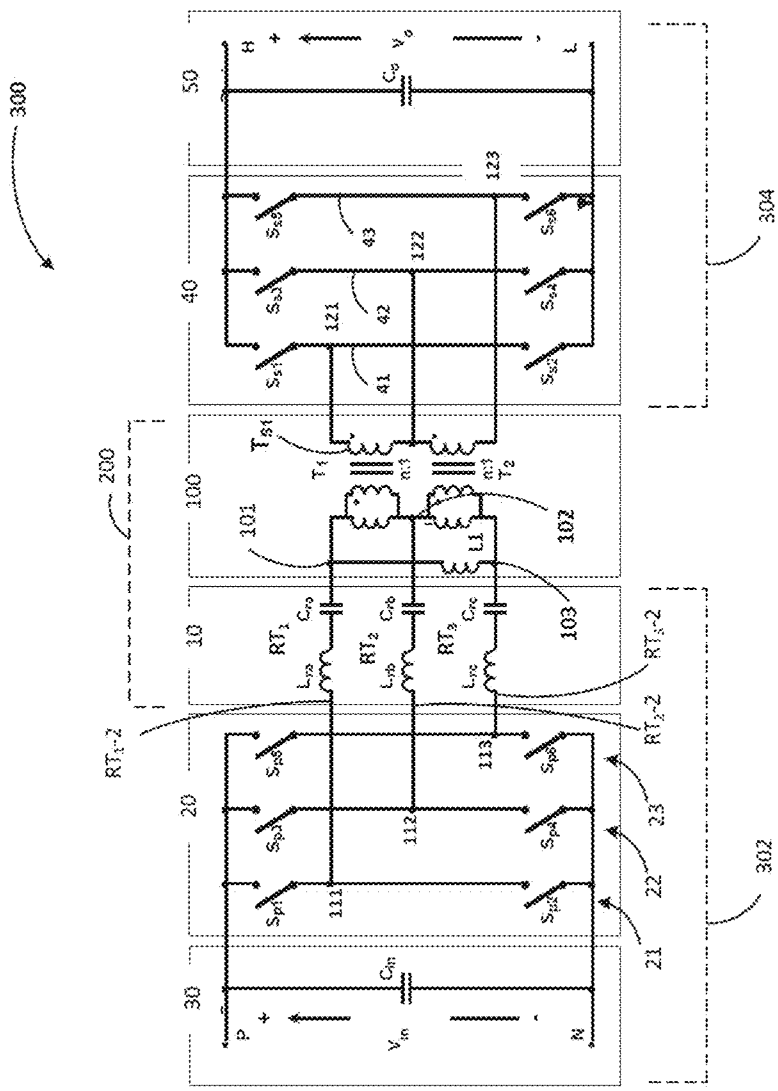
FIG. 4 illustrates a schematic diagram of an exemplary three-phase DC-DC resonant converter system incorporating aspects of the disclosed embodiments.

In one embodiment, the primary side of the transformer circuit 100 is configured to be connected to a resonant tank circuit, such as the resonant tank circuit 10 illustrated in FIG. 1. In the examples of FIGS. 1, 3 and 4, and as will be described further below, the resonant tank circuit 10 is a three-phase resonant tank circuit.

Referring to FIGS. 3 and 4, in one embodiment, the first input node 101 on the primary side of the transformer circuit 100 is configured to be connected to a first branch $RT_1$ of the resonant tank circuit 10. The second input node 102 on the primary side of the transformer circuit 100 is configured to be connected to a second branch $RT_2$ of the resonant tank circuit 10. The third input node 103 on the primary side of the transformer circuit 100 is configured to be connected to a third branch $RT_3$ of the resonant tank circuit 10. The first, second and third branches $RT_1$, $RT_2$ and $RT_3$ are connected to different phases of the three-phase power input.

The transformer circuit 100 shown in FIG. 2 includes a secondary side comprising three connection points or output nodes 121, 122 and 123. The secondary side of the transformer circuit 100 is configured to deliver a three-phase power output.

In one embodiment, the first output node 121 is formed by a third terminal T1-3 of the first transformer T1. The second output node 122 is formed by a connection of a fourth terminal T1-4 of the first transformer T1 and a fourth terminal T2-4 of the second transformer T2. The third output node 123 is formed by a third terminal T2-3 of the second transformer T2.

The output nodes 121, 122 and 123 of the secondary side of the transformer circuit 100 is configured to be connected to a rectifier circuit, such as the three-phase rectifier circuit 40 shown in FIGS. 1 and 4. In this example, the first output node 121 is configured to be connected to first branch 41 of the rectifier circuit 40. The second output node 122 is configured to be connected to a second branch 42 of the rectifier and the third output node 123 is configured to be connected to a third branch 43 of the rectifier circuit 40.

The resonant converter system 300 shown in FIG. 1 includes a resonant converter circuit 200. The resonant converter circuit 200 generally comprises a resonant tank circuit 10 and the transformer circuit 100. In one embodiment, as illustrated for example in FIGS. 3 and 4, the resonant tank circuit 10 is connected to the nodes 101, 102 and 103 on the primary side of the transformer circuit 100. The resonant tank circuit 10 can be configured to contain a single or multi-resonant tank in each phase.

The first branch $RT_1$ of the resonant tank circuit 10 is connected between a first input node 111 of the inverter circuit 20 and the first input node 101 of the transformer circuit 100. The second branch $RT_2$ of the resonant tank circuit 10 is connected between a second input node 112 of the inverter circuit 20 and the second input node 102 of the transformer circuit 100. The third branch $RT_3$ of the resonant tank circuit 10 is connected between the third input node 113 of the inverter circuit 20 and the third input node 103 of the transformer circuit 100.

As is illustrated in FIG. 4, the resonant tank circuit 10 generally comprises an LLC type resonant tank and includes inductors $L_{ra}$, $L_{rb}$ and $L_{rc}$ in each branch $RT_1$, $RT_2$ and $RT_3$, respectively. The inductors $L_{ra}$, $L_{rb}$, $L_{rc}$ in each branch or phase are followed by a respective capacitor $C_{ra}$, $C_{rb}$ and $C_{rc}$. The inductors $L_{ra}$, $L_{rb}$ and $L_{rc}$, are the resonant inductors and can be constructed with independent cores or integrated in one single core. The capacitors $C_{ra}$, $C_{rb}$ and $C_{rc}$ are the resonant capacitors.

In one embodiment, the first branch $RT_1$ of the resonant tank circuit 10 comprises the inductor $L_{ra}$ connected in series with the capacitor $C_{ra}$. A first end $RT_1$-1 of the first branch $RT_1$ is configured to be connected to the first node 101 of the transformer circuit 100. A first terminal of the capacitor $C_{ra}$ forms the first end $RT_1$-1 in this example. A first terminal of the inductor $L_{ra}$ forms the second end $RT_1$-2 of the first branch $RT_1$ and is connected to the first input node 111 of the inverter circuit 20.

The second branch RT2 of the resonant tank circuit 10 comprises the inductor $L_{rb}$, connected in series with the capacitor $C_{rb}$. A first end $RT_2$-1 of the second branch $RT_2$ is configured to be connected to the second node 102 of the transformer circuit 100. A first terminal of the capacitor $C_{rb}$ forms the first end $RT_2$-1 in this example. A first terminal of the inductor $L_{rb}$ forms the second end $RT_2$-2 of the second branch $RT_2$ and is connected to the second input node 112 of the inverter circuit 20.

The third branch RT3 of the of the resonant tank circuit 10 comprises the inductor $L_{rc}$ connected in series with the capacitor $C_{rc}$. A first end $RT_3$-1 of the third branch $RT_3$ is configured to be connected to the third node 103 of the transformer circuit 100. A first terminal of the capacitor $C_{rc}$ forms the first end $RT_3$-1 in this example. A first terminal of the inductor $L_{rc}$ forms the third end $RT_3$-2 of the third branch $RT_3$ and is connected to the third input node 113 of the inverter circuit 20.

FIG. 4 is a schematic diagram of a three-phase resonant DC-DC converter system 300 incorporating aspects of the disclosed embodiments. The three-phase resonant DC-DC converter 300 is configured to receive a DC power $V_{in}$ and create a three-phase alternating current (AC) power appropriate for driving the resonant converter circuit 200. The inverter or switching circuit 20 is configured to receive the DC input power $V_{in}$ from the DC voltage input circuit 30 across positive (+) and negative (−) input rails P, N. An input capacitor $C_{in}$ is coupled across the input rails P, N and provides filtering of the DC input power $V_{in}$.

In the example of FIG. 4, the inverter circuit 20 includes three half bridge circuits 21, 22, 23 are coupled in parallel across the DC input power $V_{in}$ and may be operated to produce a three-phase power at three output nodes 111, 112, 113. Each half bridge circuit 21, 22, 23 includes a pair of switches. $S_{p1}$, $S_{p2}$; $S_{p3}$, $S_{p4}$; and $S_{p5}$, $S_{p6}$, respectively. Each switch $S_{p1}$, $S_{p2}$, $S_{p3}$, $S_{p4}$, $S_{p5}$, $S_{p6}$ is configured to be operated, i.e. turned on or off, by a switch control signal (not shown). These pairs of switches allow the input nodes 111, 112, 113 to be alternately coupled to the positive input rail P or to the negative input rail N to create an AC power signal at the corresponding output node 121, 122, 123, as is generally understood.

The switches $S_{p1}$, $S_{p2}$, $S_{p3}$, $S_{p4}$, $S_{p5}$, and $S_{p6}$ can be any suitable type of transistors, such as for example, metal-oxide-semiconductor field-effect-transistors, (MOSFET), insulated gate bipolar transistor (IGBT), GaN High Electron Mobility transistors (GaN-HEMT), and metal-oxide-semiconductor-controlled thyristor (MCT). The semiconductor material of the devices can be based on silicon (Si), silicon-carbide (SiC), GaN as well as other semiconductor materials, or any combination thereof.

The resonant converter 200 is followed by the three-phase rectifying bridge cell or circuit 40 that is configured to receive a three-phase AC power and produce a DC output power $V_o$. The exemplary rectifier circuit 40 receives a three-phase AC power at the three rectifier circuit 40 input nodes 121, 122, 123. The three-phase AC input power in this example is produced by the resonant circuit 200.

The DC output voltage circuit 50 includes a positive (+) output rail H and a negative (−) output rail L for the DC output power $V_o$. An output filter capacitor $C_o$ is coupled across the positive (+) and negative (−) output rails H, L and is configured to filter noise and reduce ripple from the output power $V_o$.

Three half bridge circuits 41, 42, 43 are coupled in parallel across the output rails H, L. Each half bridge circuit 41, 42, 43 is configured to receive one phase of the three-phase AC power at a center or input node 121, 122, 123 of each half bridge circuit 41, 42, 43 respectively.

Each half bridge circuit 41, 42, 43 uses a pair of switches $S_{s1}$, $S_{s2}$; $S_{s3}$, $S_{s4}$; and $S_{s5}$, $S_{s6}$, respectively to rectify the three-phase AC power from the resonant converter 200. As with switches $S_{p1}$, $S_{p2}$, $S_{p3}$, $S_{p4}$, $S_{p5}$, $S_{p6}$ on the primary side of the converter system 300, the switches $S_{s1}$, $S_{s2}$, $S_{s3}$, $S_{s4}$, $S_{s5}$, and $S_{s6}$ may be any appropriate type of switching device configured to conduct, or not conduct, electric current based on switch control signals. If synchronous rectification (SR) is not implemented, the switches can comprise diodes.

Figure 5:
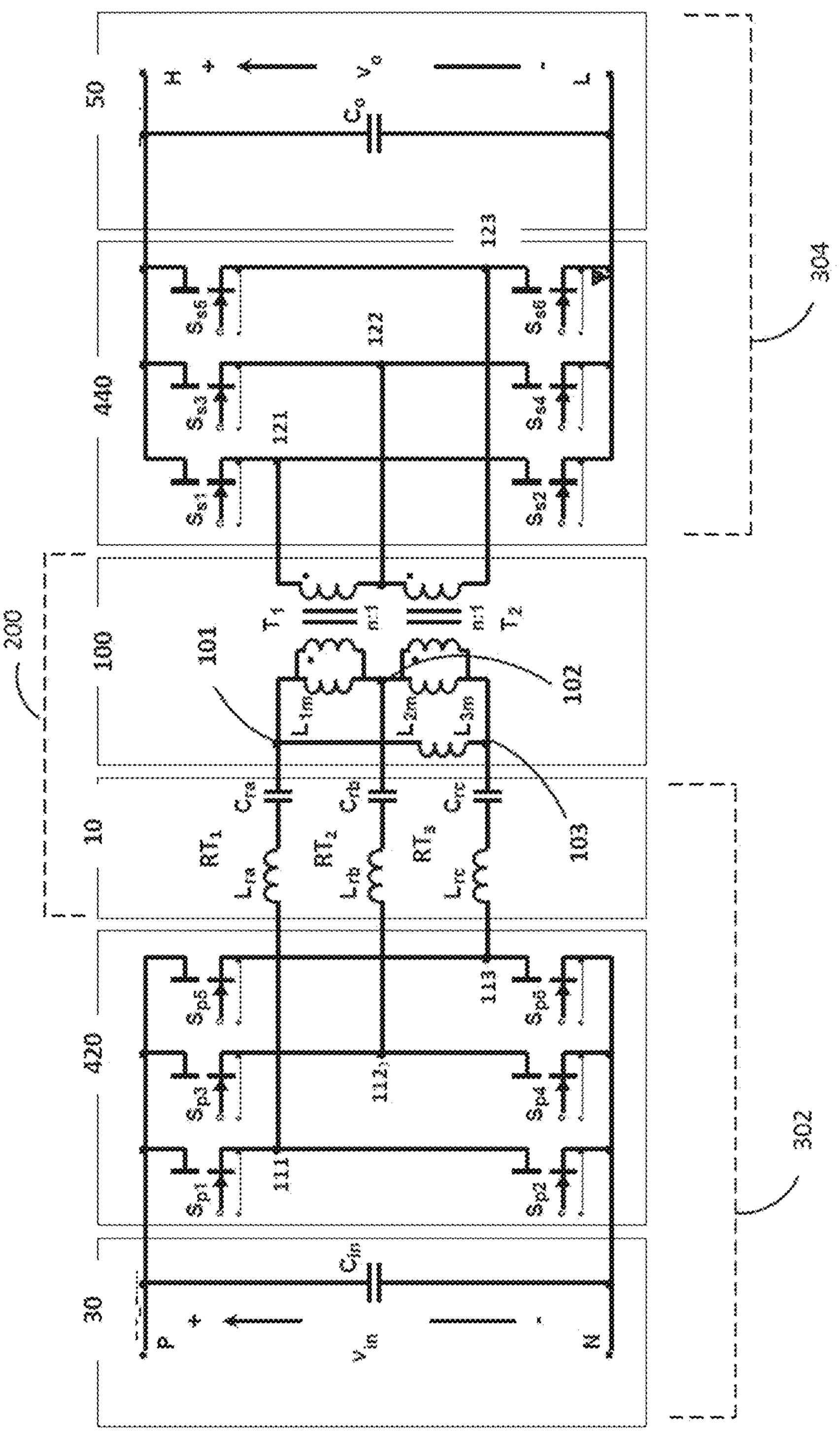
FIG. 5 illustrates a schematic diagram an exemplary three-phase DC-DC resonant converter system incorporating aspects of the disclosed embodiments.

FIG. 5 illustrates one embodiment of a resonant converter system incorporating aspects of the disclosed embodiments. In this example, the switches $S_{p1}$, $S_{p2}$, $S_{p3}$, $S_{p4}$, $S_{p5}$, $S_{p6}$ of the inverter circuit 420 on the primary side of the converter system and the switches $S_{s1}$, $S_{s2}$, $S_{s3}$, $S_{s4}$, $S_{s5}$, $S_{s6}$ of the rectifier circuit 440 on the secondary side of the converter system are wide band GaN-HEMT transistors.

Figure 6:
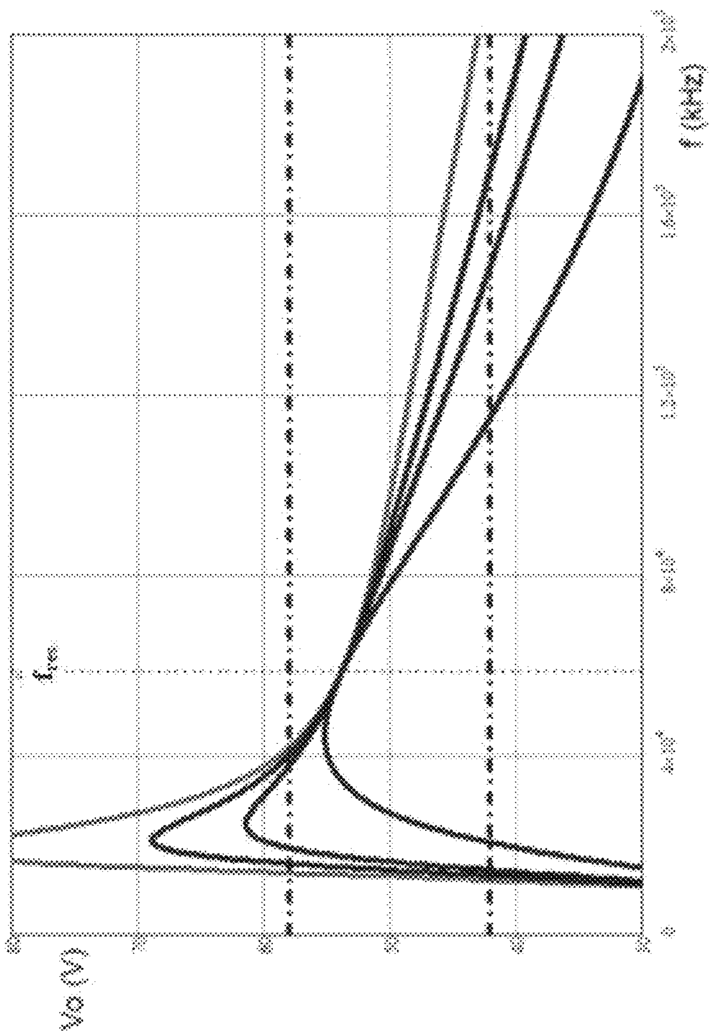
FIG. 6 illustrates a graph showing voltage gain characteristics for a resonant circuit incorporating aspects of the disclosed embodiments.

FIG. 6 illustrates exemplary voltage gain characteristics for different quality factors of a three-phase resonant DC-DC converter system 300 incorporating aspects of the disclosed embodiments. The DC output voltage $V_o$ in volts (V) is presented along the Y-axis while the frequency f in kilohertz (kHz) is presented along the X-axis. As can be seen from the graphs, the natural resonance frequency $f_{res}$ is similar to the LLC type resonant converter.

Figure 7:
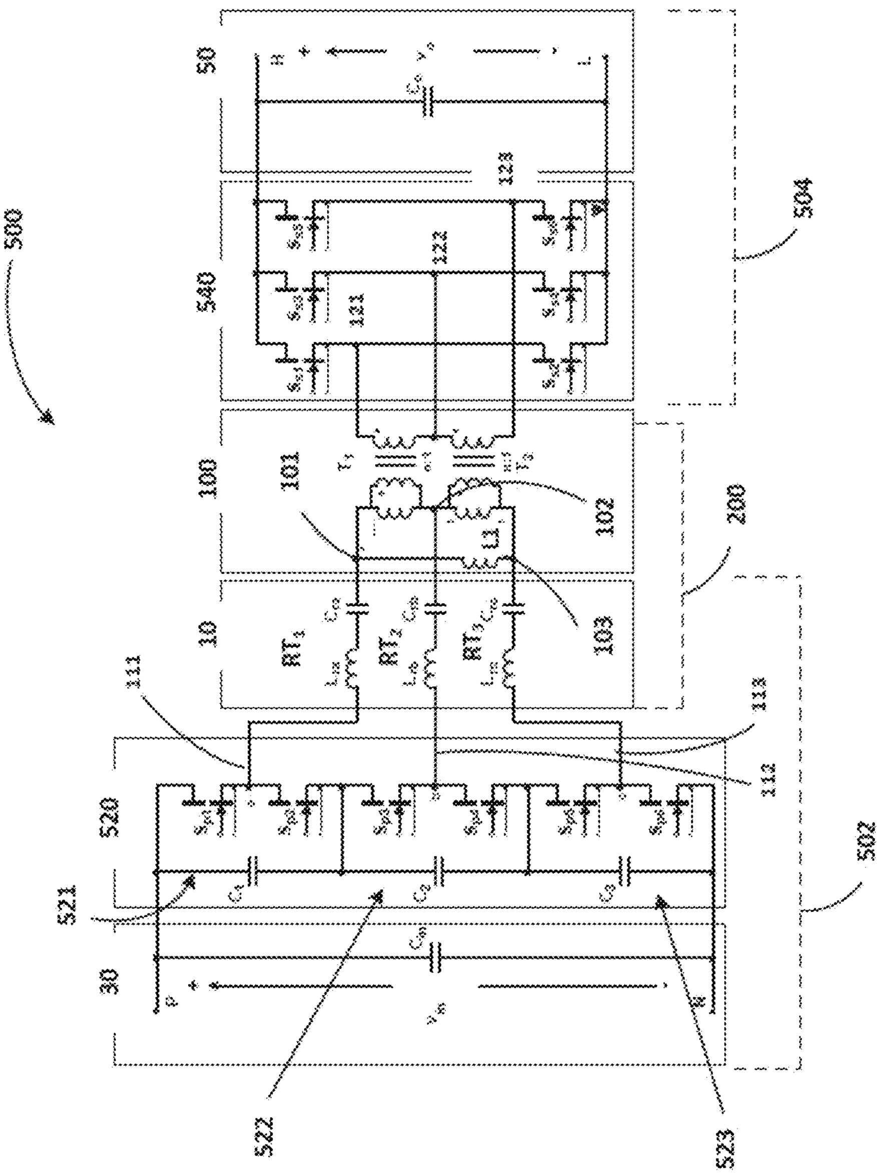
FIG. 7 illustrates an exemplary multi-level three-phase DC-DC resonant converter system incorporating aspects of the disclosed embodiments.

The two-transformer, three-phase resonant DC-DC converter 300 of the disclosed embodiments is suitable for any application that requires galvanic isolation and independence of the voltage value in the output of the system. FIG. 7 illustrates one embodiment of a two-transformer, three-phase resonant converter system 500 for a high voltage application. In this example, the resonant converter system 500 is a multi-level converter. The primary side 502 of the resonant converter system 500 includes a multi-level inverter circuit 520.

In this example, the inverter circuit 520 includes pairs of switches $S_{p1}$, $S_{p2}$; $S_{p3}$, $S_{p4}$; and $S_{p5}$, $S_{p6}$ that are connected in series with each other and a capacitor bank of series connected capacitors $C_1$, $C_2$ and $C_3$ is connected between the positive rail P and the negative rail N. A first terminal of capacitor $C_1$ is connected to the positive rail P and a first terminal of switch $S_{p1}$. A second terminal of capacitor $C_1$ is connected to a first terminal of capacitor $C_2$, a second terminal of switch $S_{p2}$ and a first terminal of switch $S_{p3}$. The second terminal of switch $S_{p1}$ is connected to the first terminal of switch $S_{p2}$ and the connection forms output node 111. The output node 111 is connected to the first branch $RT_1$ of the resonant tank 10.

The second terminal of capacitor $C_2$ is connected to the second terminal of switch $S_{p4}$, the first terminal of capacitor $C_3$ and the first terminal of switch $S_{p5}$. The second terminal of switch $S_{p3}$ is connected to the first terminal of switch $S_{p4}$ and forms output node 112. Node 112 is connected to the second branch $RT_2$ of the resonant tank 10.

The second terminal of capacitor $C_3$ is connected to the negative rail N and the second terminal of switch $S_{p6}$. The second terminal of switch $S_{p5}$ is connected to the first terminal of switch $S_{p6}$ and the connection form output node 113. Node 113 is connected to the third branch $RT_3$ of the resonant tank 10.

Each switch $S_{p1}$, $S_{p2}$, $S_{p3}$, $S_{p4}$, $S_{p5}$, $S_{p6}$ is configured to be operated, i.e. turned on or off, by a switch control signal to produce the three-phase power suitable to drive the resonant converter circuit 200. In one embodiment, the switching pattern of the control signals is phase shifted 120 degrees among each half-bridge leg 521, 522, 523 of the inverter circuit 520. In this example, the switches $S_{p1}$, $S_{p2}$, $S_{p3}$, $S_{p4}$, $S_{p5}$, $S_{p6}$ in the inverter circuit 520 on the primary side 502 and the switches $S_{s1}$, $S_{s2}$, $S_{s3}$, $S_{s4}$, $S_{s5}$, $S_{s6}$ in the rectifier circuit 540 on the secondary side 504 are wide band GaN-HEMT transistors. In alternate embodiments, the resonant converter system 500 can include any suitable switch types other than including wide band GaN-HEMT transistors.

The aspects of the disclosed embodiments are directed to a two-transformer, three-phase resonant DC-DC converter. The two-transformer circuit of the disclosed embodiments reduces the number of transformer windings, which results in a reduction in volume, weight and cost. The reliability of the resonant converter is increased, due to less losses in the transformer, which also eases the management of heat in the transformer. The number of capacitors needed for the input and output filters of the resonant converter is reduced, which also results in a reduction in volume, weight and cost. The inductors of the resonant tank can be integrated with each other into one single core. This topology results in a simplified and more efficient layout of the resonant converter components.

The voltage gain characteristic of the resonant converter of the disclosed embodiments is greater than one. This enables boost and buck modes of operation. Additionally, storage elements are not needed in order to achieve ZVS on the primary side of the resonant converter and ZCS on the secondary side of the resonant converter.

The resonant converter of the disclosed embodiments is suitable for any application that requires galvanic isolation and independence of the voltage value in the output of the system. Exemplary implementations include energy flow management for telecom power supplies. The two-transformer circuit of the disclosed embodiments can be applied to any three-phase topological circuit, including resonant and pulse wave modulated circuits. The circuits can be implemented for any power level as there is no inherent limitation in the topological circuits itself. The circuits can be extended for any number of converters and different kinds of connections (serial/parallel). A primary characteristic of the two-transformer, three-phase resonant converter circuit of the disclosed embodiments is that it can operate as a LLC type resonant converter.

Thus, while there have been shown, described and pointed out, fundamental novel features of the application as applied to the exemplary embodiments thereof, it will be understood that various omissions, substitutions and changes in the form and details of devices and methods illustrated, and in their operation, may be made by those skilled in the art without departing from the spirit and scope of the presently disclosed application. Further, it is expressly intended that all combinations of those elements, which perform substantially the same function in substantially the same way to achieve the same results, are within the scope of the application. Moreover, it should be recognized that structures and/or elements shown and/or described in connection with any disclosed form or embodiment of the application may be incorporated in any other disclosed or described or suggested form or embodiment as a general matter of design choice. It is the intention, therefore, to be limited only as indicated by the scope of the claims appended hereto.

What is claimed is:

1. A transformer circuit, comprising:

a first transformer;

a second transformer, a first terminal of the first transformer being coupled to a first terminal of the second transformer;

an inductor coupled between a second terminal of the first transformer and a second terminal of the second transformer; and a secondary side configured to deliver a three-phase power output using only two transformers, the two transformers comprising the first transformer and the second transformer, and the secondary side comprising:

a first output node formed by a third terminal of the first transformer;

a second output node formed by coupling a fourth terminal of the first transformer and a fourth terminal of the second transformer; and a third output node formed by a third terminal of the second transformer.

2. The transformer circuit of claim 1, further comprising a primary side configured to receive a three-phase power input, and the primary side comprising:

a first input node formed by coupling the second terminal of the first transformer and a first terminal of the inductor;

a second input node formed by coupling the first terminal of the first transformer and the first terminal of the second transformer; and a third input node formed by coupling the second terminal of the second transformer and a second terminal of the inductor.

3. The transformer circuit of claim 2, wherein the first input node is configured to receive a first phase of the three-phase power input, the second input node is configured to receive a second phase of the three-phase power input, and the third input node is configured to receive a third phase of the three-phase power input.

4. The transformer circuit of claim 2, wherein the primary side of the transformer circuit is coupled to a resonant tank circuit to receive the three-phase power input.

5. The transformer circuit of claim 4, wherein the first input node is coupled to a first branch of the resonant tank circuit to receive a first phase of the three-phase power input, the second input node is coupled to a second branch of the resonant tank circuit to receive a second phase of the three-phase power input, and the third input node is coupled to a third branch of the resonant tank circuit to receive a third phase of the three-phase power input.

6. The transformer circuit of claim 1, wherein the secondary side is coupled to a three-phase rectifier circuit to deliver the three-phase power output, the first output node is coupled to a first branch of the three-phase rectifier circuit, the second output node is coupled to a second branch of the three-phase rectifier circuit, and the third output node is coupled to a third branch of the three-phase rectifier circuit.

7. A resonant converter circuit, comprising:

a resonant tank circuit; and a transformer circuit coupled to the resonant tank circuit, the transformer circuit comprising:

a first transformer;

a second transformer, a first terminal of the first transformer being coupled to a first terminal of the second transformer;

an inductor coupled between a second terminal of the first transformer and a second terminal of the second transformer, the resonant tank circuit being coupled to a primary side of the transformer circuit; and a secondary side configured to deliver a three-phase power output using only two transformers, the two transformers comprising the first transformer and the second transformer, and the secondary side comprising:

a first output node formed by a third terminal of the first transformer;

a second output node formed by coupling a fourth terminal of the first transformer and a fourth terminal of the second transformer; and a third output node formed by a third terminal of the second transformer.

8. The resonant converter circuit of claim 7, wherein the resonant tank circuit comprises:

a first branch coupled to a first input node of the transformer circuit;

a second branch coupled to a second input node of the transformer circuit; and a third branch coupled to a third input node of the transformer circuit.

9. The resonant converter circuit of claim 8, wherein the first branch is coupled between a first input node of the resonant tank circuit and the first input node of the transformer circuit, the second branch is coupled between a second input node of the resonant tank circuit and the second input node of the transformer circuit, and the third branch is coupled between a third input node of the resonant tank circuit and the third input node of the transformer circuit.

10. The resonant converter circuit of claim 9, wherein the first branch comprises a first branch inductor coupled in series with a first branch capacitor, a first end of the first branch is coupled to the first input node of the transformer circuit, the second branch comprises a second branch inductor coupled in series with a second branch capacitor, a first end of the second branch is coupled to the second input node of the transformer circuit, the third branch comprises a third branch inductor coupled in series with a third branch capacitor, and a first end of the third branch is coupled to the third input node of the transformer circuit.

11. A three-phase resonant direct current-direct current (DC-DC) converter system, comprising:

a primary side;

a secondary side; and a transformer circuit coupled between the primary side and the secondary side, the transformer circuit comprising:

a first transformer;

a second transformer, a first terminal of the first transformer being coupled to a first terminal of the second transformer, an inductor coupled between a second terminal of the first transformer and a second terminal of the second transformer; and a secondary side configured to deliver a three-phase power output using only two transformers, the two transformers comprising the first transformer and the second transformer, and the secondary side comprising:

a first output node formed by a third terminal of the first transformer;

a second output node formed by coupling a fourth terminal of the first transformer and a fourth terminal of the second transformer; and a third output node formed by a third terminal of the second transformer.

12. The three-phase resonant DC-DC converter system of claim 11, wherein the primary side comprises a DC voltage input circuit configured to receive a DC input voltage, a resonant tank circuit is coupled to the transformer circuit to provide a three-phase power input to the transformer circuit, and a switching circuit is coupled between the DC voltage input circuit and the resonant tank circuit.

13. The three-phase DC-DC converter system of claim 12, wherein the secondary side comprises a three-phase rectification circuit coupled between the transformer circuit and a DC voltage output circuit, and the three-phase rectification circuit is configured to receive a three-phase power output signal from the transformer circuit.

14. The three-phase DC-DC converter system of claim 13, wherein switches in the switching circuit and switches in the three-phase rectification circuit comprise gallium-nitride (GaN) transistors.

* * * * *